US008659279B2

(12) United States Patent  (10) Patent No.: US 8,659,279 B2
George et al.  (45) Date of Patent: Feb. 25, 2014

(54) AUTOMATIC POWER CONVERTER BYPASS

(75) Inventors: Mark Steven George, Wilsonville, OR (US); Charles Lawrence Bernards, Lake Oswego, OR (US)

(73) Assignee: Cooper Technologies Company, Houston, TX (US)

( * ) Notice: Subject to any disclaimer, the term of this patent is extended or adjusted under 35 U.S.C. 154(b) by 321 days.

(21) Appl. No.: 13/182,584

(22) Filed: Jul. 14, 2011

(65) Prior Publication Data

US 2013/0015833 A1  Jan. 17, 2013

(51) Int. Cl.
G05F 1/575 (2006.01)
G05F 1/569 (2006.01)

(52) U.S. Cl.
USPC .............................. 323/284; 323/272; 361/111

(58) Field of Classification Search
USPC ................. 323/222, 224, 225, 282, 284, 285; 361/111; 363/271, 272
See application file for complete search history.

(56) References Cited

U.S. PATENT DOCUMENTS

| 5,161,097 A * | 11/1992 | Ikeda ........................... 363/124 |
| 2003/0001434 A1 * | 1/2003 | Saito et al. ................... 307/10.1 |
| 2003/0021073 A1 | 1/2003 | Nagata |
| 2005/0243494 A1 | 11/2005 | Strong, III et al. |
| 2006/0006850 A1 * | 1/2006 | Inoue et al. .................. 323/265 |
| 2010/0231185 A1 * | 9/2010 | Yu et al. ....................... 323/282 |
| 2010/0239303 A1 | 9/2010 | Matsumoto |

FOREIGN PATENT DOCUMENTS

| JP | 2001028832 A | 1/2001 |
| JP | 2001238454 A | 8/2001 |
| JP | 2002112537 A | 4/2002 |
| JP | 2010246293 A | 10/2010 |

OTHER PUBLICATIONS

International Search Report and Written Opinion of International Application No. PCT/US2012/046432; Nov. 8, 2012; 12 pages.

* cited by examiner

*Primary Examiner* — Gary L Laxton

(74) *Attorney, Agent, or Firm* — Armstrong Teasdale LLP

(57) ABSTRACT

A power converter includes a bypass circuit connected in parallel with a power stage of the power converter. The bypass circuit provides a lower loss current path in parallel with the power stage when an input voltage of the power converter exceeds a predetermined threshold. The power converter may be a boost power converter used in a vehicle to provide power from a main power bus of the vehicle to a subsystem of the vehicle such as an anti-lock brake system.

23 Claims, 5 Drawing Sheets

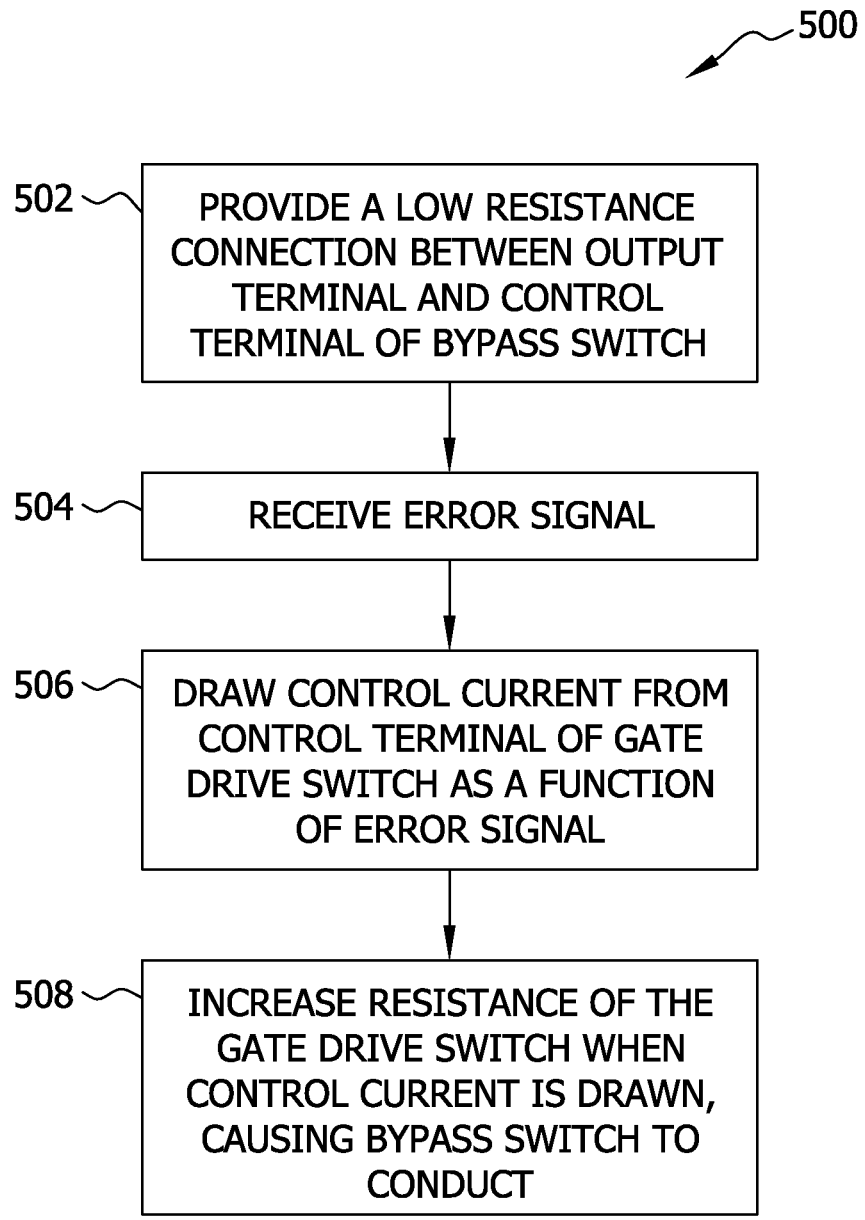

AUTOMATIC POWER CONVERTER BYPASS

BACKGROUND OF THE INVENTION

The field of the invention relates generally to DC to DC power converters, and more specifically to DC to DC power converters for use in electrical power systems, for example, in the power systems of vehicles.

Direct current to Direct current (DC-DC or DC to DC) power converters are used in vehicles to step up and/or regulate a voltage. For example, a DC to DC power converter may be used to power an anti-lock brake system (ABS) from a vehicle's main power bus. The voltage of the power bus may vary significantly from a minimum of about 7 volts during engine cranking to a maximum of about 50 volts when systems drawing a load (e.g., headlights) are shut off. If the main power bus is nominally 12 volts, a DC to DC power converter may be used to step up the voltage to 24 volts for ABS brakes. If the main power bus is nominally 24 volts, a DC to DC power converter may pass the bus voltage through to the ABS brakes when the bus voltage exceeds 24 volts and boost the voltage when the bus voltage is less than 24 volts. One type of DC to DC power converter useful in this type of application is a boost power converter. A boost power converter boosts input voltages less than a target output voltage and passes input voltages through that exceed the target output voltage. Boost power converters may be damaged by excessive input voltage or by heat produced when passing an input voltage higher than the target output voltage through to an output of the boost power converter. It is desirable to provide a DC to DC boost power converter which efficiently passes through input voltages in excess of a target output voltage that is protected from input voltages in excess of a target output voltage.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

FIG. 5 is a flow chart of a method for selectively bypassing a power stage of a power converter.

DETAILED DESCRIPTION OF THE INVENTION

A DC to DC boost power converter including a transient voltage protection circuit and a bypass circuit are disclosed herein. Generally, the transient voltage protection circuit blocks an input voltage from the boost power converter if the input voltage to the boost power converter exceeds a predetermined threshold The bypass circuit provides a lower loss current path in parallel with the boost power converter when the input voltage exceeds a target output voltage of the boost power converter. The lower loss current path increases the transfer efficiency of the boost power converter, protecting the boost power converter from excess heat buildup. In one embodiment, the lower loss current path has voltage drop less than the voltage drop of a forward biased diode. The current path can be provided by a semiconductor switch (e.g., bipolar junction transistor, MOSFET, etc.) biased so as to conduct current between an input terminal and an output terminal of the switch. The semiconductor switch may also be specially selected or configured for a lower than standard drain to source resistance when biased to conduct. The transient voltage protection circuit and bypass circuit are described herein in connection with their application to a boost power converter. It is contemplated that the transient voltage protection circuit and bypass circuit may be used in other types of power converters.

Figure 1:
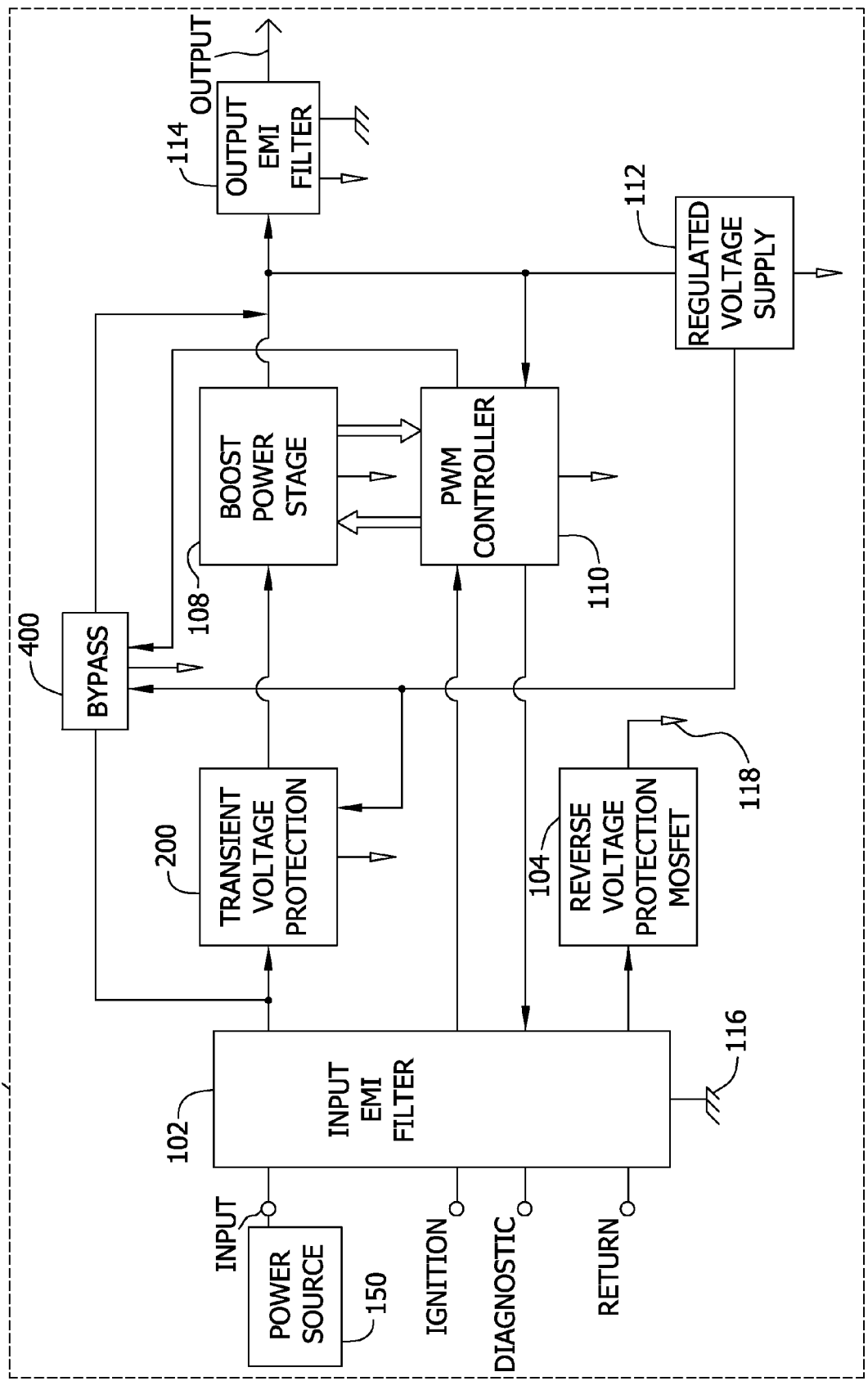
FIG. 1 is a block diagram of a vehicle electrical system including a boost power converter.

Referring to FIG. 1, one embodiment of a boost power converter in an electrical system 100 includes an input electromagnetic interference (EMI) filter 102, a reverse voltage protection MOSFET 104, a transient voltage protection circuit 200, a transient voltage bypass circuit 400, a boost power stage 108, a pulse width modulation (PWM) controller 110, a regulated voltage supply 112, and an output EMI filter 114. The electrical system 100 is part of a vehicle including a power source 150. In one embodiment, the power source 150 is a mechanical type power source such as a generator or alternator converting mechanical energy from an internal combustion engine into electrical power. The input EMI filter 102 has an input terminal for receiving an input voltage (e.g., 12 volts DC nominal with a range from about 7 volts to 50 volts) and an ignition input for receiving an ignition signal indicating whether the boost power converter should be upconverting the input voltage to a target output voltage. The input EMI filter 102 also includes a diagnostic port for providing information on operation of the boost power converter, a return terminal for connecting to a ground reference of the input voltage, and a system ground terminal 116 for connecting to system ground (e.g., chassis ground). The input EMI filter 102 reduces emissions from the boost power converter and distributes the received input voltage to other portions of the boost power converter. In a vehicular application, the input terminal is connected to a positive terminal of a battery, and the return terminal is connected to a negative terminal of the battery. An alternator or generator may be connected in parallel with the battery. The reverse voltage protection MOSFET 104 is connected between a circuit ground 118 and the system ground 116 to prevent damage to the boost power converter in the event that the boost power converter is connected to a negative voltage source such as if the input and return terminals are reversed during installation.

The regulated voltage supply 112 is connected to an output of the boost power stage 108 and to circuit ground 118. The regulated voltage supply 112 provides various regulated housekeeping voltages to portions of the boost power converter. It is contemplated that the regulated voltage supply 112 may receive power from a source other than the output of the boost power stage 108 such as from the input voltage at the input terminal of the input EMI filter 102.

The PWM controller 110 receives the ignition signal from the input EMI filter 102 and determines whether to operate the boost power stage 108 as a function of the received signal. The PWM controller 110 is also connected to the output of the boost power stage 108 and a current monitoring output of the boost power stage 108 for determining adjustments to a switching pattern of the boost power stage 108. The PWM controller 110 is connected to circuit ground 118 and a control output communicates the determined switching pattern to the boost power stage 108 while a diagnostics output is connected to the diagnostic port of the input EMI filter 102 for providing data on the operation of the boost power converter.

The boost power stage 108 receives the input voltage via the transient voltage protection circuit 200 and the switching pattern from the PWM controller 110. If the input voltage is about equal to or greater than a target output voltage, the boost power stage 108 passes the input voltage to the output of the boost power stage 108 via a diode internal to the boost power stage 108. If the input voltage is less than the target output voltage, then the boost power stage 108 boosts the input voltage to the target output voltage.

The output EMI filter 114 receives the output from the boost power stage 108 and provides an output for the boost power converter that minimizes radio frequency noise. The output EMI filter 114 is connected to both circuit ground 118 and system ground 116.

Figure 2:
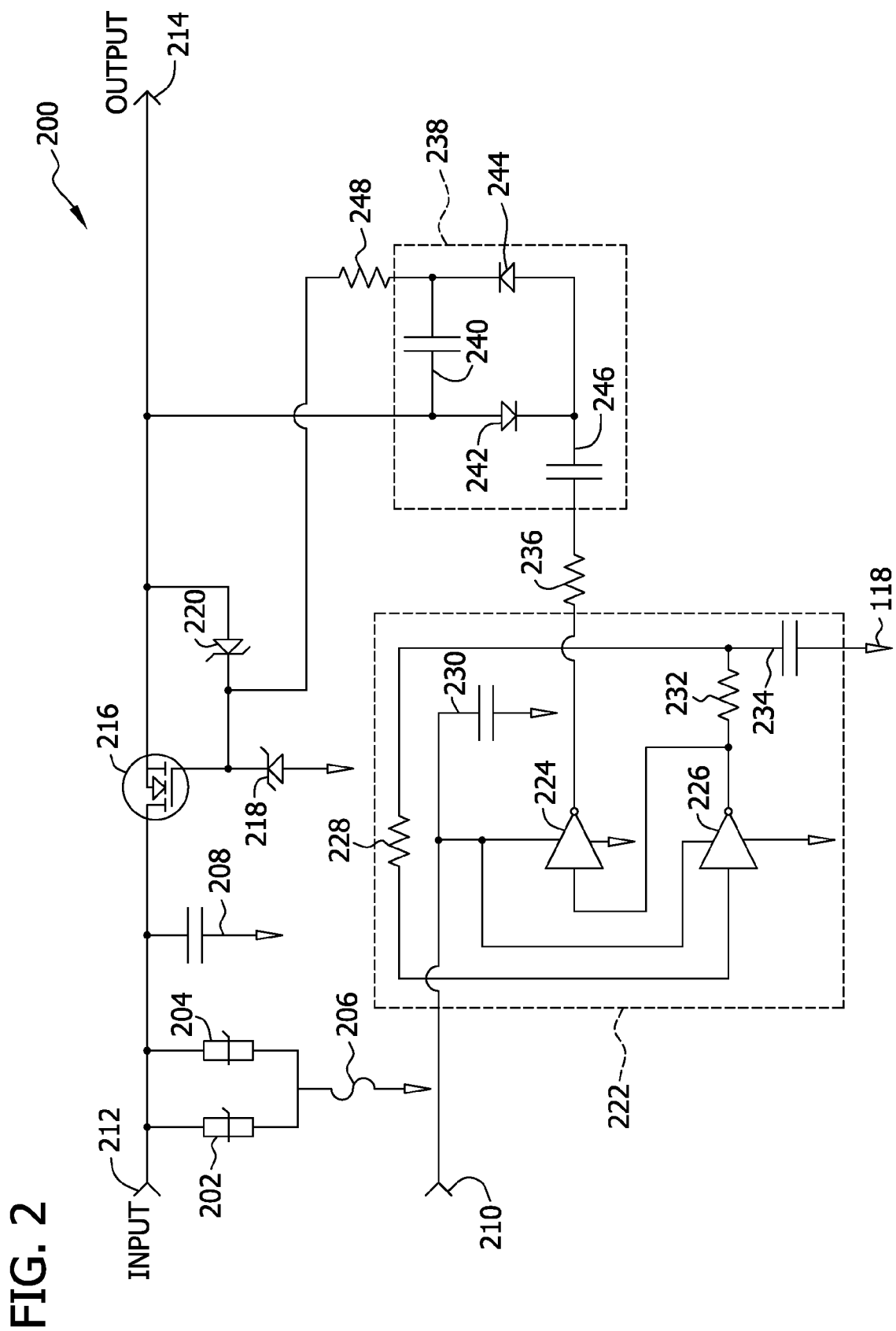
FIG. 2 is a schematic diagram of a transient voltage protection circuit.

Referring to FIG. 2, one embodiment of the transient voltage protection circuit 200 is shown. The transient voltage protection circuit 200 is connected between the input EMI filter 102 and the boost power stage 108 and blocks the input voltage from the boost power stage 108 when the input voltage exceeds a predetermined threshold. The transient voltage protection circuit 200 receives the input voltage at a first input 212 and a housekeeping supply voltage at second input 210. The transient voltage protection circuit 200 includes multiple connections to circuit ground 118 and an output 214 which is connected to an input of the boost power stage 108. Two metal oxide varistors, 202 and 204, are connected in parallel between the first input 212 and a first terminal of a fuse 206. A second terminal of the fuse 206 is connected to circuit ground 118. In one embodiment, the varistors, 202 and 204, have an 80 volt threshold, and the fuse 206 has a 15 ampere limit. A smoothing capacitor 208 is connected between the first input 212 and circuit ground 118.

A blocking switch 216 includes an input terminal, an output terminal, and a control terminal. The input terminal is connected to the first input 212, and the output terminal is connected to the output 214. The control terminal is connected to circuit ground 118 via a zener diode 218 which limits a voltage of the control terminal relative to circuit ground 118. A zener diode 220 has a cathode connected to the control terminal of the bypass switch 216 and an anode connected to the output terminal of the bypass switch 216. The zener diode 220 is an electrostatic discharge protection device that protects the bypass switch from electrostatic discharge and other events that would cause a damaging voltage between the control terminal and output terminal of the bypass switch 216. The zener diode 220 has a threshold voltage greater than the turn-on threshold voltage of the blocking switch 216. In one embodiment, the voltage limiter 218 is a zener diode having a 33 volt threshold, and the bypass switch 216 is a low on resistance (i.e., lower resistance than a forward biased diode) N-channel MOSFET.

An oscillator 222 of the transient voltage blocking circuit is connected to the housekeeping supply voltage at the second input 210. The illustrated oscillator 222 is merely exemplary and other types and configurations of oscillators are contemplated within the scope of the claims. The oscillator 222 includes a first inverter 224, a second inverter 226, resistor 232, resistor 228, capacitor 230, and capacitor 234. Supply terminals of the first inverter 224 and second inverter 226 are connected to the housekeeping supply voltage at the second input 210, and the second input 210 is connected to circuit ground 118 via capacitor 230. An output of the first inverter 224 is connected to a charge pump circuit 238 via a first current limiting resistor 236, and ground terminals of the first inverter 224 and second inverter 226 are connected to circuit ground 118. An input of the first inverter 224 is connected to an output of the second inverter 226. The output of the second inverter 226 is also connected to ground via resistor 232 and capacitor 234 arranged in series with the capacitor 234 contacting the circuit ground 118 and the resistor 232 contacting the output of the second inverter 226. An input of the second inverter 226 is connected to circuit ground 118, and resistor 228 is connected between the input of the second inverter 226 and a junction formed at the connection of resistor 232 to capacitor 234. An output signal of the oscillator 222 drives the charge pump circuit 238. In one embodiment, the oscillator 222 provides the charge pump circuit 238 with a 0 to 10 volt peak to circuit ground alternating current (AC) square wave at about 100 kHz. It is contemplated that other voltages and frequencies may be used within the scope of the claims. In one embodiment, the housekeeping supply voltage received at the second input 210 is about is about 10.5 volts DC. Other voltage such as 12 volts DC are contemplated within the scope of the claims.

The charge pump circuit 238 of the transient voltage protection circuit 200 includes capacitor 246, diode 242, diode 244, and capacitor 240. A first terminal of capacitor 246 is connected to an output of the oscillator 222 (i.e., the output of the first inverter 224) via the first current limiting resistor 236. A second terminal of capacitor 246 is connected to a cathode of diode 242 and an anode of diode 244. An anode of diode 242 is connected to a first terminal of capacitor 240 and the transient voltage protection circuit output 214. A cathode of diode 244 is connected to a second terminal of capacitor 240 and to the control terminal of the blocking switch 216 via a second current limiting resistor 248. The charge pump circuit 238 provides a current limited DC voltage source between the output terminal of the blocking switch 216 and the control terminal of the blocking switch 216 (i.e., a positive voltage referenced to the output terminal of the blocking switch 216). In one embodiment, the charge pump circuit 238 provides approximately 10 volts DC (e.g., 8.5 to 9 volt DC which is an output signal of oscillator 222 decreased by the forward bias voltage drops of diode 242 and diode 244) between the output terminal of the blocking switch 216 and the control terminal of the blocking switch 216.

When the input voltage to the boost power converter is not in excess of the predetermined threshold, the charge pump circuit 238 biases the blocking switch 216 into a low resistance state such that the input voltage of the boost power converter received at input terminal 212 of the transient voltage protection circuit 200 is passed through to the output terminal 214 of the transient voltage protection circuit 200 with minimal loss. When the input voltage to the boost power converter exceeds the threshold voltage of the voltage limiter 218, current is drawn from the charge pump circuit 238. Because the charge pump circuit 238 is current limited, the voltage between the control terminal and the output terminal of the blocking switch 216 decreases. When the voltage between the control terminal and the output terminal of the blocking switch 216 reaches a threshold (i.e., turn on/off voltage) of the blocking switch 216, the resistance of the blocking switch 216 increases, isolating the input terminal 212 of the transient voltage protection circuit 200 from the output terminal 214 of the transient voltage protection circuit 214, blocking the input voltage of the power converter from the boost power stage 108.

Figure 3:
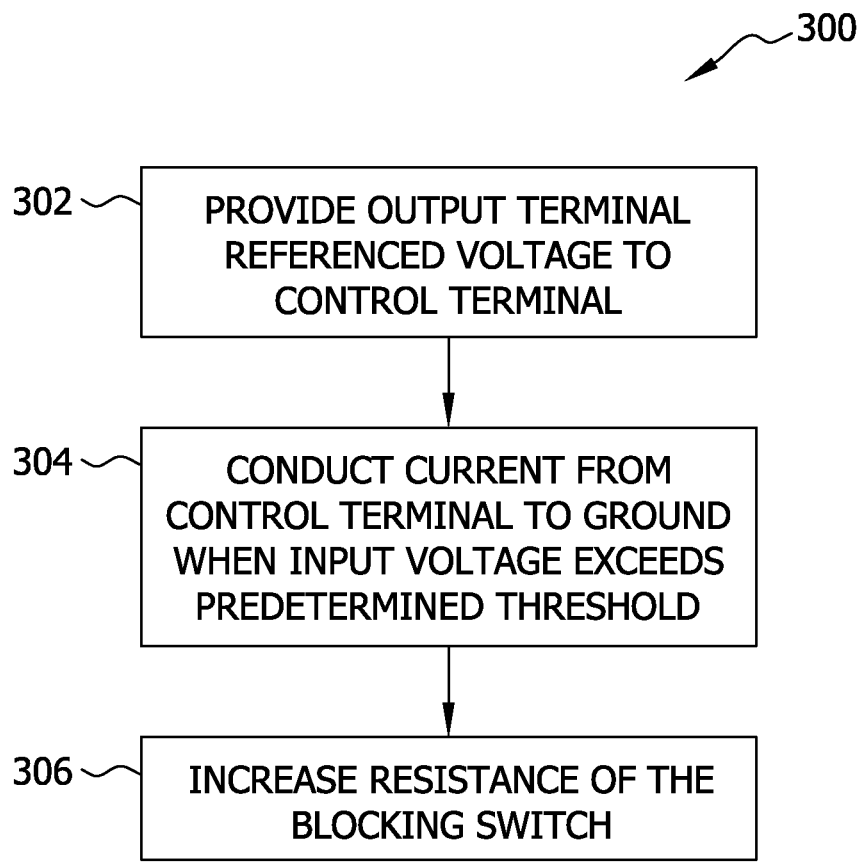
FIG. 3 is a flow chart of a method for protecting a power converter from a transient voltage.

Referring to FIG. 3, a method 300 of selectively blocking an input voltage from a power stage of a power converter begins at 302 by providing an output terminal referenced, current limited voltage to a control terminal of a blocking switch. At 304, when the input voltage exceeds a predetermined threshold, a zener diode conducts current from the control terminal of the blocking switch to a ground of the power converter to maintain the control terminal voltage at about the predetermined threshold voltage. At 306, a resistance of the blocking switch increases in response to a decreased voltage difference between the control terminal and the output terminal of the blocking switch, blocking the input voltage from the power stage of the power converter.

Figure 4:
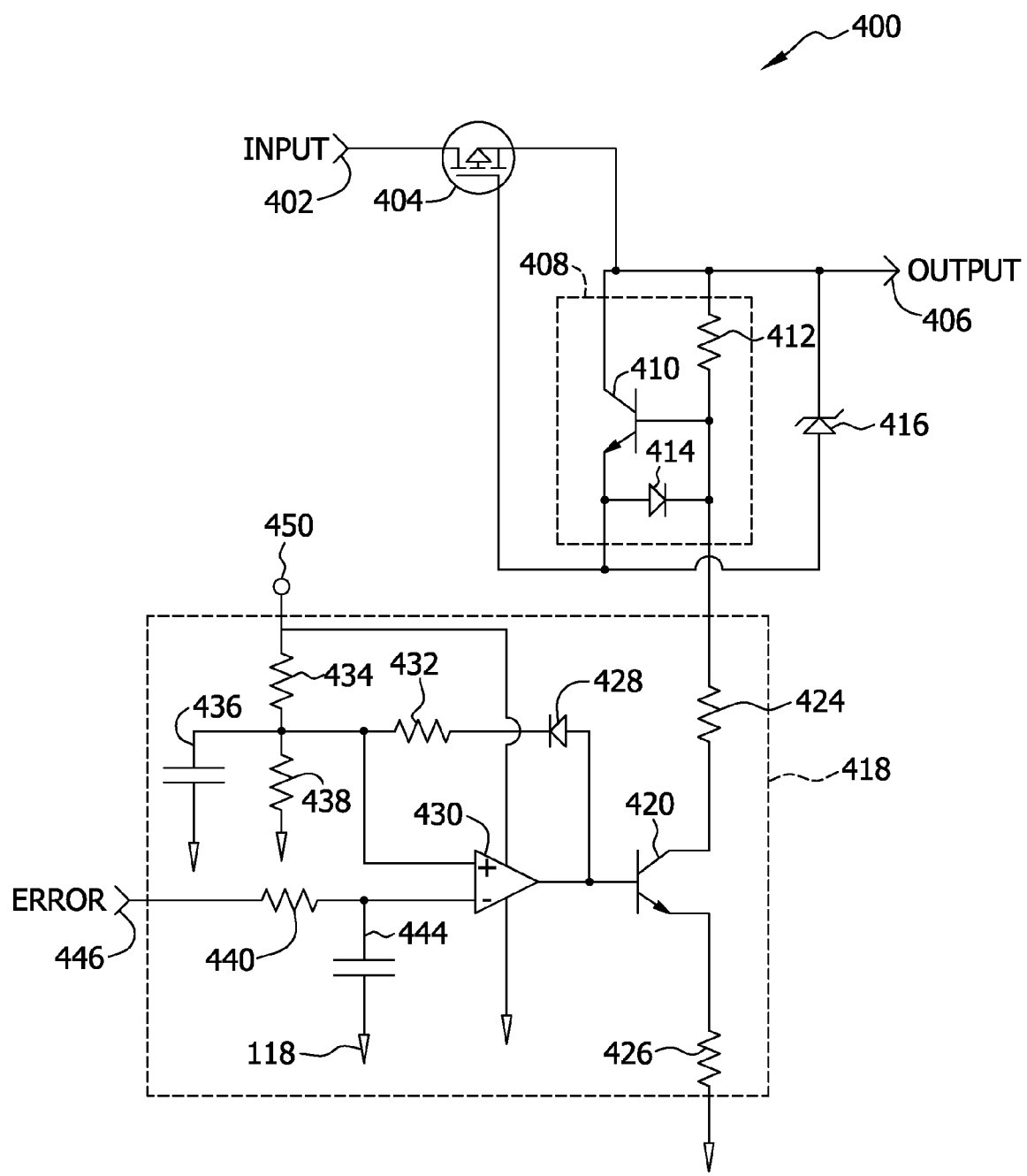
FIG. 4 is a schematic diagram of a transient voltage bypass circuit.

Referring to FIG. 4, transient voltage bypass circuit 400 includes an input 402 receiving the input voltage of the boost power converter from the input EMI filter 102, a bias supply terminal 450 receiving a housekeeping supply voltage from regulated voltage supply 112, an error signal input 446 receiving an error signal from the PWM controller 110, and an output terminal 406. The error signal from the PWM controller 110 indicates whether the PWM controller 110 is operating the boost power stage 108 to increase the input voltage of the boost power converter to the target output voltage. The bypass circuit 400 uses the error signal to determine whether to provide a lower loss current path in parallel with the boost power stage 108. The bypass circuit 400 provides the lower loss current path in parallel with the boost power stage 108 when the boost power stage is not increasing the input voltage of the boost power converter to the target output voltage of the boost power converter.

The bypass circuit 400 includes a bypass switch 404, a level translating gate drive circuit 408, and a current sink 418. In operation, the current sink 418 receives the error signal and determines when to provide the lower loss current path in parallel with the boost power stage 108 as a function of the error signal. When the current sink 418 determines that the lower loss current path should be provided, the current sink 418 draws a current from the level translating gate drive circuit 408, and the level translating gate drive circuit 408 causes the bypass switch 404 to become conductive. When the current sink 418 determines that the lower loss current path should not be provided, the current sink 418 draws no current from the level translating gate drive circuit 408, and the level translating gate drive circuit 408 causes the bypass switch to be non-conductive.

The bypass switch 404 has an input terminal, an output terminal, and a control terminal. The input terminal is connected to the bypass circuit input terminal 402, and the output terminal is connected to the bypass circuit output terminal 406. The control terminal of the bypass switch 404 is connected to the bypass circuit output terminal 406 via a zener diode 416 whose anode is connected to the control terminal and cathode is connected to the bypass circuit output terminal 406. The zener diode 416 protects the bypass switch 404 from adverse circuit conditions such as electrostatic discharge which could damage the bypass switch 404.

The level translating gate drive circuit 408 includes a gate drive switch 410, a diode 414, and a resistor 412. An input terminal of the gate drive switch 410 is connected to the output terminal of the bypass switch 404, an output terminal of the gate drive switch 410 is connected to the control terminal of the bypass switch 404, and a control terminal of the gate drive switch 410 is connected to the output terminal of the bypass switch via resistor 412. An anode of the diode 414 is connected to the output terminal of the gate drive switch 410, and a cathode of the diode 414 is connected to the control terminal of the gate drive switch 410. In one embodiment, the gate drive switch 410 is an NPN bipolar junction transistor.

The current sink 418 includes a comparator 430 and a sink switch 420. An input terminal of the sink switch 420 is connected to the control terminal of the gate drive switch 410 via a first resistor 424, and an output terminal of the sink switch 420 is connected to circuit ground 118 via a second resistor 426. The sink switch 420, first resistor 424 and second resistor 426 form a current source. A control terminal of the sink switch 420 is connected to an output of the comparator 430. In one embodiment, the sink switch is an NPN bipolar junction transistor. The comparator 430 is connected to the bias supply terminal 450 for receiving a housekeeping supply voltage (e.g., a 5 volt DC bias supply or a 10.5 volt DC bias supply) from the regulated voltage supply 112. A ground terminal of the comparator 430 is connected to circuit ground 118. An inverting input of the comparator 430 is connected to the error signal input 446 via resistor 440, and to circuit ground 118 via capacitor 444. A non-inverting input of the comparator 430 is connected to the bias supply terminal 450 via resistor 434 and to circuit ground 118 via resistor 438. Resistor 432 and resistor 438 form a voltage divider network for providing a reference voltage to the non-inverting input of the comparator 430 for comparison to the error signal. Capacitor 436 is connected between the non-inverting input of the comparator 430 and circuit ground 118 for reducing noise on the reference voltage. Resistor 432 and diode 428 are connected in series to form a feedback loop between the output of the comparator 430 and the non-inverting input of the comparator 430. An anode of diode 428 is connected to the output of the comparator 430.

In one embodiment, the comparator 430 is an operational amplifier, the reference voltage established at the non-inverting input of the comparator 430 is about between 0.5 volts DC, and the bypass circuit 400 is configured to cause the bypass switch 404 to conduct from its input terminal to its output terminal when the input voltage of the power converter is about 30 volts or greater. Thus, when the target output voltage is 25 volts and the input voltage is between 25 and 30 volts, the input voltage of the power converter is conducted to the output of the power converter via a diode in the boost power stage. The error signal varies from about 0 to 5 volts where 0 volts indicates that the PWM controller 110 is not operating the boost power stage 108 to increase or convert the input voltage of the boost power converter and 5 volts indicates that the PWM controller 110 is operating the boost power stage 108 at maximum output to increase or convert the input voltage of the boost power converter to the target output voltage. When the error signal is greater than 0.5 volts, the output of the comparator 430 is low, and the sink switch 420 is not conducting current from the input terminal of the sink switch 420 to the output terminal of the sink switch 420. Thus, the control terminal of the gate drive switch 410 is pulled up to the input terminal of the gate drive switch 410 through resistor 412, and the gate drive switch 410 is conductive from its input terminal to its output terminal. This connects the control terminal of the bypass switch 404 to the output terminal of the bypass switch 404, causing the bypass switch to be nonconductive from its input terminal to its output terminal. When the error signal is less than 0.5 volts, the output signal of the comparator 430 is high (i.e., 5 volts in this example), and the sink switch 420 is conductive from its input terminal to its output terminal. The current sink 418 thus draws a control current from the control terminal of the gate drive switch 410, causing the gate drive switch to be nonconductive from its input terminal to its output terminal. The control terminal of the bypass switch 404 is pulled down through diode 414, and the bypass switch 404 becomes conductive from its input terminal to its output terminal.

Referring to FIG. 5, a method 500 of selectively providing a lower loss current path in parallel with a power stage of a power converter begins at 502. At 502, a gate drive switch provides a lower loss connection between an output terminal and a control terminal of a bypass switch. At 504, an error signal is received indicating whether the power stage is boosting the input voltage of the power converter to the target output voltage. At 506, a current sink draws a control current from a control terminal of the gate drive switch when the error signal indicates that the input voltage of the power stage is equal to or greater than the target output voltage of the power stage. At 508, the gate drive switch resistance is increased in response to the control current being drawn from the control terminal of the gate drive switch. A voltage between the control terminal and the output terminal of the bypass switch increases beyond a threshold voltage of the bypass switch, and the bypass switch becomes conductive from its input terminal to its output terminal.

It is contemplated that the power converter may be used in any application, and may be of a type other than a boost power converter. In vehicular applications, the input voltage to the power converter may be, for example 12 volts or 24 volts nominal DC. It is contemplated that the vehicle may be any self propelled vehicle. For example, the vehicle 100 may be a truck, automobile, bus, recreational vehicle, boat, ship, airplane, helicopter, all terrain vehicle, motorcycle, or golf cart. The vehicle 100 may also be a specialty vehicle such as a skid steer, forklift, mining vehicle, off highway dump truck, swing shovel, dragline, or locomotive. The power converter may power ABS brakes, an air compressor, or any other device on the vehicle. The power converter may also be used in an application other than a vehicle.

It is contemplated that various devices and components of the DC to DC power converter of FIGS. 1, 2, and 4 may be implemented in various ways and considered part of different components or sections of the power converter than as described herein. For example, although the bypass switch is shown as a P-channel MOSFET, other devices such as bipolar junction transistors may be used in its place. The blocking switch is shown as an N-channel MOSFET, but other types of switches may be used. Further, oscillator 222 may be replaced by any oscillator design, and the input terminal of the bypass circuit 400 may be connected to the input or the output of the transient voltage bypass circuit 200. All of these permutations are considered within the scope of the invention disclosed herein.

In one embodiment, a transient voltage bypass circuit comprises a bypass switch connected in parallel with a power stage of a power converter, the bypass switch having an input terminal, an output terminal, and a control terminal, a level translating gate drive circuit connected between the control terminal of the bypass switch and the output terminal of the bypass switch, wherein the level translating gate drive circuit causes the bypass switch to conduct when a control current is drawn from the level translating gate drive circuit, and a current sink for selectively drawing the control current from the level translating gate drive circuit as a function of an error signal from the power stage of the power converter. The error signal indicates whether the power stage of the power converter is converting an input voltage of the power stage to a target output voltage. The level translating gate drive circuit provides a low resistance path between the control terminal of the bypass switch and the output terminal of the bypass switch unless the control current is being drawn from the level translating gate drive circuit. The current sink comprises a comparator for receiving the error signal from the power stage and selectively providing a high output signal to a current source as a function of a voltage of the error signal. The current source draws the control current from the level translating gate drive circuit when receiving the high output signal from the comparator. The level translating gate drive circuit comprises a gate drive switch having an input terminal, an output terminal, and a control terminal, wherein the input terminal of the gate drive switch is connected to the output terminal of the bypass switch; a voltage reduction resistor connected between the control terminal of the gate drive switch and the output terminal of the bypass switch; and a diode having an anode connected to the output terminal of the gate drive switch and a cathode connected to the control terminal of the gate drive switch. The current sink is connected to the gate level translating gate drive circuit at the control terminal of the gate drive switch. The current sink comprises a sink switch and a comparator, wherein an input terminal of the sink switch is connected to the level translating gate drive circuit, a control terminal of the sink switch is connected to an output of the comparator, and an output terminal of the sink switch is connected to a ground of the power converter. The input terminal of the sink switch is connected to the level translating gate drive circuit via a first resistor, and the output terminal of the sink switch is connected to the ground of the power converter via a second resistor. The bypass switch is a P-channel MOSFET.

In one embodiment, a power converter comprises a power stage for receiving an input voltage and providing an output voltage, wherein the output voltage is approximately equal to the input voltage when the input voltage is equal to or greater than a target output voltage, and a transient voltage bypass circuit connected in parallel with the power stage, the transient voltage bypass circuit providing a current path parallel to the power stage when the input voltage is approximately equal to or greater than the target output voltage. The transient voltage bypass circuit comprises a bypass switch connected in parallel with the power stage of the power converter, the bypass switch having an input terminal, an output terminal, and a control terminal; a level translating gate drive circuit connected between the control terminal of the bypass switch and the output terminal of the bypass switch, wherein the level translating gate drive circuit causes the bypass switch to conduct when a control current is drawn from the level translating gate drive circuit; and a current sink for selectively drawing the control current from the level translating gate drive circuit as a function of an error signal from the power stage of the power converter. The error signal indicates whether the input voltage is less than the target output voltage and the power stage of the power converter is boosting the input voltage of the power stage to the target output voltage. The level translating gate drive circuit provides a low resistance connection between the control terminal of the bypass switch and the output terminal of the bypass switch unless the control current is being drawn from the level translating gate drive circuit. The current sink comprises a comparator for receiving the error signal from the power stage and selectively providing a high output signal to a current source as a function of a voltage of the error signal, wherein the current source draws the control current from the level translating gate drive circuit when receiving the high output signal from the comparator. The level translating gate drive circuit comprises a gate drive switch having an input terminal, an output terminal, and a control terminal, wherein the input terminal of the gate drive switch is connected to the output terminal of the bypass switch; a voltage reduction resistor connected between the control terminal of the gate drive switch and the output terminal of the bypass switch; and a diode having an anode connected to the output terminal of the gate drive switch and a cathode connected to the control terminal of the gate drive switch. The current sink is connected to the gate level translating gate drive circuit at the control terminal of the gate drive switch. The current sink comprises a sink switch and a comparator, wherein an input terminal of the sink switch is connected to the level translating gate drive circuit, a control terminal of the sink switch is connected to an output of the comparator, and an output terminal of the sink switch is connected to a ground of the power converter, and wherein the input terminal of the sink switch is connected to the level translating gate drive circuit via a first resistor, and the output terminal of the sink switch is connected to the ground of the power converter via a second resistor. The bypass switch is a P-channel MOSFET, and the current path provided by the transient voltage bypass circuit has a resistance that is less than the resistance of a forward biased diode.

In one embodiment, a method of selectively providing a lower loss current path in parallel with a power stage of a power converter comprises providing a low resistance connection between an output terminal and a control terminal of a bypass switch via a gate drive switch of a level translating gate drive circuit; receiving an error signal indicating whether an input voltage of the power stage is less than a target output voltage of the power stage and the power stage is boosting the input voltage to the target output voltage; drawing a control current from a control terminal of the gate drive switch when the received error signal indicates that the input voltage of the power stage is approximately equal to or greater than the target output voltage of the power stage; and increasing the resistance of the gate drive switch in response to the drawing the control current from the control terminal of the gate drive switch such that a voltage between the control terminal of the bypass switch and the output terminal of the bypass switch is equal to or greater than a threshold voltage of the bypass switch. The power stage is a boost power stage, the power converter is a boost power converter, and the bypass switch is a P-channel MOSFET.

In one embodiment, an electrical system comprises a power source for providing electrical power, and a power converter for receiving the electrical power from the power source and providing power to a device. The power converter comprises a power stage for receiving an input voltage and providing an output voltage, wherein the output voltage is approximately equal to the input voltage when the input voltage is equal to or greater than a target output voltage; and a transient voltage bypass circuit connected in parallel with the power stage, the transient voltage bypass circuit providing a current path parallel to the power stage when the input voltage is approximately equal to or greater than the target output voltage. The power source converts mechanical energy into electrical power, the device is an anti-lock brake system of a vehicle, and the power converter is a boost power converter.

In one embodiment, a vehicle comprises a device for receiving power and an electrical system for providing power to the device. The electrical system comprises a power source for providing electrical power and a power converter for receiving the electrical power from the power source and providing power to a device The power converter comprises a power stage for receiving an input voltage and providing an output voltage, wherein the output voltage is approximately equal to the input voltage when the input voltage is equal to or greater than a target output voltage; and a transient voltage bypass circuit connected in parallel with the power stage, the transient voltage bypass circuit providing a current path parallel to the power stage when the input voltage is approximately equal to or greater than the target output voltage. The power source converts mechanical energy into electrical power, the device is an anti-lock brake system of a vehicle, and the power converter is a boost power converter.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A transient voltage bypass circuit comprising:
   a bypass switch connected in parallel with a power stage of a power converter, said bypass switch having an input terminal, an output terminal, and a control terminal;
   a level translating gate drive circuit connected between the control terminal of the bypass switch and the output terminal of the bypass switch, wherein the level translating gate drive circuit causes the bypass switch to conduct when a control current is drawn from the level translating gate drive circuit; and
   a current sink for selectively drawing the control current from the level translating gate drive circuit as a function of an error signal from the power stage of the power converter.

2. The transient voltage bypass circuit of claim 1, wherein the error signal indicates whether the power stage of the power converter is converting an input voltage of the power stage to a target output voltage.

3. The transient voltage bypass circuit of claim 1, wherein the level translating gate drive circuit provides a low resistance path between the control terminal of the bypass switch and the output terminal of the bypass switch unless the control current is being drawn from the level translating gate drive circuit.

4. The transient voltage bypass circuit of claim 1, wherein the current sink comprises a comparator for receiving the error signal from the power stage and selectively providing a high output signal to a current source as a function of a voltage of the error signal, wherein said current source draws the control current from the level translating gate drive circuit when receiving the high output signal from the comparator.

5. The transient voltage bypass circuit of claim 1, wherein the level translating gate drive circuit comprises:
   a gate drive switch having an input terminal, an output terminal, and a control terminal, wherein the input terminal of the gate drive switch is connected to the output terminal of the bypass switch;
   a voltage reduction resistor connected between the control terminal of the gate drive switch and the output terminal of the bypass switch; and
   a diode having an anode connected to the output terminal of the gate drive switch and a cathode connected to the control terminal of the gate drive switch.

6. The transient voltage bypass circuit of claim 5, wherein the current sink is connected to the gate level translating gate drive circuit at the control terminal of the gate drive switch.

7. The transient voltage bypass circuit of claim 1, wherein the current sink comprises a sink switch and a comparator, wherein an input terminal of the sink switch is connected to the level translating gate drive circuit, a control terminal of the sink switch is connected to an output of the comparator, and an output terminal of the sink switch is connected to a ground of the power converter.

8. The transient voltage bypass circuit of claim 7 wherein the input terminal of the sink switch is connected to the level translating gate drive circuit via a first resistor, and the output terminal of the sink switch is connected to the ground of the power converter via a second resistor.

9. The transient voltage bypass circuit of claim 1 wherein the bypass switch is a P-channel MOSFET.

10. A power converter comprising:
- a power stage for receiving an input voltage and providing an output voltage, wherein the output voltage is approximately equal to the input voltage when the input voltage is equal to or greater than a target output voltage; and
- a transient voltage bypass circuit connected in parallel with the power stage, said transient voltage bypass circuit providing a current path parallel to the power stage when the input voltage is approximately equal to or greater than the target output voltage;
- wherein the transient voltage bypass circuit comprises:
  - a bypass switch connected in parallel with the power stage of the power converter, said bypass switch having an input terminal, an output terminal, and a control terminal;
  - a level translating gate drive circuit connected between the control terminal of the bypass switch and the output terminal of the bypass switch, wherein the level translating gate drive circuit causes the bypass switch to conduct when a control current is drawn from the level translating gate drive circuit; and
  - a current sink for selectively drawing the control current from the level translating gate drive circuit as a function of an error signal from the power stage of the power converter.

11. The power converter of claim 10, wherein the error signal indicates whether the input voltage is less than the target output voltage and the power stage of the power converter is boosting the input voltage of the power stage to the target output voltage.

12. The power converter of claim 10, wherein the level translating gate drive circuit provides a low resistance connection between the control terminal of the bypass switch and the output terminal of the bypass switch unless the control current is being drawn from the level translating gate drive circuit.

13. The power converter of claim 10, wherein the current sink comprises a comparator for receiving the error signal from the power stage and selectively providing a high output signal to a current source as a function of a voltage of the error signal, wherein said current source draws the control current from the level translating gate drive circuit when receiving the high output signal from the comparator.

14. The power converter of claim 10, wherein the level translating gate drive circuit comprises:
- a gate drive switch having an input terminal, an output terminal, and a control terminal, wherein the input terminal of the gate drive switch is connected to the output terminal of the bypass switch;
- a voltage reduction resistor connected between the control terminal of the gate drive switch and the output terminal of the bypass switch; and
- a diode having an anode connected to the output terminal of the gate drive switch and a cathode connected to the control terminal of the gate drive switch.

15. The power converter of claim 14, wherein the current sink is connected to the gate level translating gate drive circuit at the control terminal of the gate drive switch.

16. The power converter of claim 10, wherein the current sink comprises a sink switch and a comparator, wherein an input terminal of the sink switch is connected to the level translating gate drive circuit, a control terminal of the sink switch is connected to an output of the comparator, and an output terminal of the sink switch is connected to a ground of the power converter, and wherein the input terminal of the sink switch is connected to the level translating gate drive circuit via a first resistor, and the output terminal of the sink switch is connected to the ground of the power converter via a second resistor.

17. The power converter of claim 10, wherein the bypass switch is a P-channel MOSFET, and the current path provided by the transient voltage bypass circuit has a voltage drop that is less than the voltage drop of a forward biased diode.

18. A method of selectively providing a lower loss current path in parallel with a power stage of a power converter, said method comprising:
- providing a low resistance connection between an output terminal and a control terminal of a bypass switch via a gate drive switch of a level translating gate drive circuit;
- receiving an error signal indicating whether an input voltage of the power stage is less than a target output voltage of the power stage and the power stage is boosting the input voltage to the target output voltage;
- drawing a control current from a control terminal of the gate drive switch when the received error signal indicates that the input voltage of the power stage is approximately equal to or greater than the target output voltage of the power stage; and
- increasing the resistance of the gate drive switch in response to said drawing the control current from the control terminal of the gate drive switch such that a voltage between the control terminal of the bypass switch and the output terminal of the bypass switch is equal to or greater than a threshold voltage of the bypass switch.

19. The method of claim 18, wherein the power stage is a boost power stage, the power converter is a boost power converter, and the bypass switch is a P-channel MOSFET.

20. An electrical system comprising:
- a power source for providing electrical power;
- a power converter for receiving the electrical power from the power source and providing power to a device, said power converter comprising:
  - a power stage for receiving an input voltage and providing an output voltage, wherein the output voltage is approximately equal to the input voltage when the input voltage is equal to or greater than a target output voltage; and
  - a transient voltage bypass circuit connected in parallel with the power stage, said transient voltage bypass circuit providing a current path parallel to the power stage when the input voltage is approximately equal to or greater than the target output voltage;
  - wherein the transient voltage bypass circuit comprises:
    - a bypass switch connected in parallel with the power stage of the power converter, said bypass switch having an input terminal, an output terminal, and a control terminal;
    - a level translating gate drive circuit connected between the control terminal of the bypass switch and the output terminal of the bypass switch, wherein the level translating gate drive circuit causes the bypass switch to conduct when a control current is drawn from the level translating gate drive circuit; and
    - a current sink for selectively drawing the control current from the level translating gate drive circuit as a function of an error signal from the power stage of the power converter.

21. The electrical system of claim 20, wherein the power source converts mechanical energy into electrical power, the device is an anti-lock brake system of a vehicle, and the power converter is a boost power converter.

22. A vehicle comprising:

a device for receiving power;

an electrical system for providing power to the device, said electrical system comprising:

a power source for providing electrical power;

a power converter for receiving the electrical power from the power source and providing power to a device, said power converter comprising:

a power stage for receiving an input voltage and providing an output voltage, wherein the output voltage is approximately equal to the input voltage when the input voltage is equal to or greater than a target output voltage; and a transient voltage bypass circuit connected in parallel with the power stage, said transient voltage bypass circuit providing a current path parallel to the power stage when the input voltage is approximately equal to or greater than the target output voltage;

wherein the transient voltage bypass circuit comprises:

a bypass switch connected in parallel with the power stage of the power converter, said bypass switch having an input terminal, an output terminal, and a control terminal;

a level translating gate drive circuit connected between the control terminal of the bypass switch and the output terminal of the bypass switch, wherein the level translating gate drive circuit causes the bypass switch to conduct when a control current is drawn from the level translating gate drive circuit; and a current sink for selectively drawing the control current from the level translating gate drive circuit as a function of an error signal from the power stage of the power converter.

23. The vehicle of claim 22, wherein the power source converts mechanical energy into electrical power, the device is an anti-lock brake system of a vehicle, and the power converter is a boost power converter.

* * * * *